United States Patent
Lee et al.

(10) Patent No.: US 7,869,264 B2
(45) Date of Patent: Jan. 11, 2011

(54) INFORMATION STORAGE DEVICES USING MAGNETIC DOMAIN WALL MOVEMENT AND METHODS OF OPERATING THE SAME

(75) Inventors: Hoo-san Lee, Osan-si (KR); Chee-kheng Lim, Yongin-si (KR); Hoon-sang Oh, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 495 days.

(21) Appl. No.: 11/980,627

(22) Filed: Oct. 31, 2007

(65) Prior Publication Data
US 2008/0158707 A1    Jul. 3, 2008

(30) Foreign Application Priority Data
Jan. 3, 2007    (KR) .................... 10-2007-0000699

(51) Int. Cl.
G11C 11/00    (2006.01)
(52) U.S. Cl. .............. 365/158; 365/148; 365/225.5; 365/80; 428/810; 360/55; 360/131
(58) Field of Classification Search .......... 365/48, 365/55, 62, 66, 74, 78, 80–93, 100, 130, 365/131, 148, 158, 171–173, 225.5, 243.5; 360/55, 131; 216/22; 257/421, E21.665; 438/3; 428/810–836; 977/933–935
See application file for complete search history.

(56) References Cited

U.S. PATENT DOCUMENTS

| | | | | |
|---|---|---|---|---|
| 5,815,342 A * | 9/1998 | Akiyama et al. | ......... | 360/97.01 |
| 5,870,328 A * | 2/1999 | Mohri | ......... | 365/135 |
| 6,566,872 B1 * | 5/2003 | Sugitani | ......... | 324/249 |
| 6,864,042 B1 | 3/2005 | Kuo et al. | | |
| 7,586,781 B2 * | 9/2009 | Saitoh et al. | ......... | 365/158 |
| 2005/0041463 A1 | 2/2005 | Drewes | | |
| 2005/0078509 A1 | 4/2005 | Parkin | | |
| 2005/0174876 A1 | 8/2005 | Katoh | | |

(Continued)

FOREIGN PATENT DOCUMENTS

GB    1 497 653    1/1978

(Continued)

OTHER PUBLICATIONS

European Search Report (dated Feb. 26, 2008) for counterpart European Patent Application No. 07123052.8-1233 is provided for the purposes of certification under 37 C.F.R. §§ 1.97(e) and 1.704(d).

(Continued)

Primary Examiner—Richard Elms
Assistant Examiner—Harry W Byrne
(74) Attorney, Agent, or Firm—Harness, Dickey & Pierce, P.L.C.

(57) ABSTRACT

An information storage device includes a record head and a data recording medium. The record head includes a magnetic substance having magnetic domain walls and records data in the data recording medium. In a method of operating the information storage device, a first high frequency current or a high frequency magnetic field is supplied to the magnetic substance while magnetic domain walls of the magnetic substance are moved.

37 Claims, 10 Drawing Sheets

U.S. PATENT DOCUMENTS

2006/0024529 A1* 2/2006 Murakami .................. 428/810
2008/0130355 A1* 6/2008 Saitoh et al. ................ 365/173

FOREIGN PATENT DOCUMENTS

WO    WO 2004/077451        9/2004

OTHER PUBLICATIONS

Fassbender, J. et al., "Magnetic patterning by means of ion irradiation and implantation," Journal of Magnetism and Magnetic Materials, Elsevier Science Publishers, Amsterdam, NL, vol. 320, No. 3-4, Oct. 25, 2007, pp. 579-596.

Fassbender, J., et al., "Topical Review; Tailoring magnetism by light-ion irradiation; Topical Review" Journal of Physics D. Applied Physics, Institute of Physics Publishing, Bristol, GB, vol. 37, No. 16, Aug. 21, 2004, pp. R179-R196.

Owen, N. et al., "Patterning Magnetic Antidot-Type Arrays by $Ga^+$ Implantation," IEEE Transactions on Magnetics, IEEE Service Center, New York, NY, vol. 38, No. 5, Sep. 2002, pp. 2553-2555.

Terris, B., et al., "Topical Review; Nanofabricated and self-assembled magnetic structures as data storage media; Topical Review" Journal of Physics D. Applied Physics, Institute of Physics Publishing, Bristol, GB, vol. 38, No. 12, Jun. 21, 2005. pp. R199-R222.

Chinese Office Action dated Sep. 8, 2010 and English translation thereof.

* cited by examiner

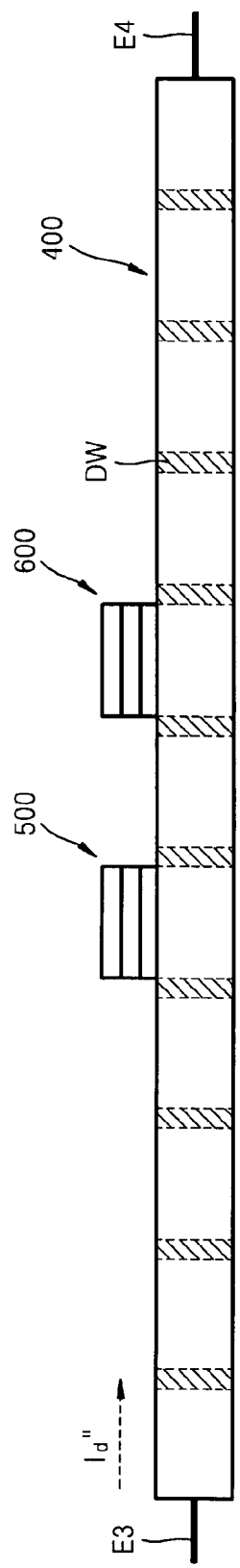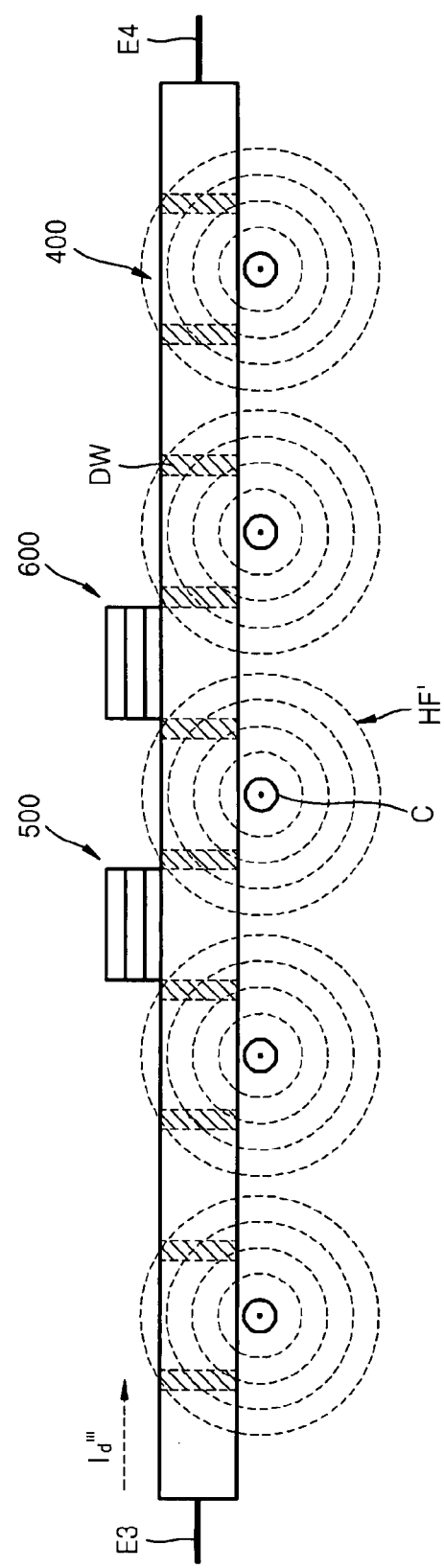

INFORMATION STORAGE DEVICES USING MAGNETIC DOMAIN WALL MOVEMENT AND METHODS OF OPERATING THE SAME

PRIORITY STATEMENT

This non-provisional patent application claims priority under 35 U.S.C. §119 to Korean Patent Application No. 10-2007-0000699, filed on Jan. 3, 2007, in the Korean Intellectual Property Office, the entire contents of which is incorporated herein by reference.

BACKGROUND

Description of the Related Art

A magnetic region that constitutes a ferromagnetic body is referred to as a magnetic domain. The rotation direction of all electrons in a magnetic domain is identical. The magnetization of a magnetic domain may be controlled by the property, shape and/or size of a magnetic substance and/or external energy.

A magnetic domain wall is a boundary portion between magnetic domains having different magnetization directions and a given volume. The magnetic domain wall may be moved by an external magnetic field or a current applied to a magnetic substance.

In conventional information storage devices using magnetic domain wall movement, magnetic domain walls may move relatively slow. Conventionally, a movement velocity of a magnetic domain wall may be in the range of about 1 to about 10 m/s, inclusive. However, an information storage device having a higher data transfer rate may be relatively difficult to produce using a device having a movement velocity of conventional magnetic domain walls such as this.

SUMMARY

Example embodiments provide information storage devices capable of increasing movement velocity of magnetic domain walls, and methods of operating the same.

At least one example embodiment provides a method of operating an information storage device including a magnetic substance having magnetic domain walls. According to at least this example embodiment, at least one of a first high frequency current and a first high frequency magnetic field may be supplied to the magnetic substance while magnetic domain walls of the magnetic substance are moved.

At least one example embodiment provides a method of operating an information storage device. According to at least this example embodiment, a first high frequency current may be supplied to the magnetic substance while magnetic domain walls of the magnetic substance move. To begin moving the magnetic domain walls, a current greater than the first high frequency current may be supplied to the magnetic substance. A second high frequency current may be supplied to the magnetic substance in a state where the magnetic domain walls are stationary.

According to at least some example embodiments, the frequency of the first and second high frequency currents may be in the range of about 1 to about 10 GHz, inclusive. The first and second high frequency currents may be same or substantially the same. Alternatively, the first and second high frequency currents may be different. The magnetic substance may include a bent portion adjacent to the data recording medium. Data recorded in the data recording medium may be determined according to a magnetization direction of a magnetic domain wall positioned in the bent portion.

At least one other example embodiment provides a method of operating an information storage device. According to at least this example embodiment, a high frequency magnetic field may be supplied to the magnetic substance while magnetic domain walls of the magnetic substance move. The frequency of the high frequency magnetic field may be in the range of about 1 to about 10 GHz, inclusive.

According to at least some example embodiments, a first current may be supplied to the magnetic substance to start moving the magnetic domain walls. After the magnetic domain walls begin moving, a second current may be supplied to the magnetic substance together with the high frequency magnetic field. The second current may be lower than the first current. The second current may be a high frequency current or a direct current. An additional high frequency magnetic field may be supplied when a current lower than the first current is supplied to the magnetic substance. The frequency of the additional high frequency magnetic field may be in the range of about 1 to about 10 GHz, inclusive.

According to at least some example embodiments, another high frequency magnetic field may be supplied to the magnetic substance in a state where the magnetic domain walls are stationary. The frequency of the other high frequency magnetic field may be in the range of about 1 to about 10 GHz, inclusive. The record head may include a wire generating the high frequency magnetic field.

According to at least some example embodiments, the magnetic substance may include a bent portion adjacent to the data recording medium. Data recorded in the data recording medium may be determined according to a magnetization direction of the magnetic domain wall positioned in the bent portion.

At least one example embodiment provides a method of operating an information storage device comprising a writer for recording data in a magnetic substance and a reader for reading data from the magnetic substance. In at least this example embodiment, a first high frequency current may be supplied to the magnetic substance while magnetic domain walls of the magnetic substance are moved. A current greater than the first high frequency current may be supplied to the magnetic substance to start moving the magnetic domain wall. A second high frequency current may be supplied to the magnetic substance in a state where the magnetic domain walls are stationary.

According to at least some example embodiments, the frequency of the first high frequency current may be in the range of about 1 to about 10 GHz, inclusive. The frequency of the second high frequency current may be in the range of about 1 to about 10 GHz, inclusive. The first and second high frequency current may be same or substantially the same. Alternatively, the first and second high frequency current may be different.

At least one other example embodiment provides a method of operating an information storage device comprising a writer for recording data in a magnetic substance and a reader for reading data from the magnetic substance. In at least this example embodiment, a high frequency magnetic field may be supplied to the magnetic substance while magnetic domain walls of the magnetic substance move.

According to at least some example embodiments, the frequency of the high frequency magnetic field may be in the range of about 1 to about 10 GHz, inclusive. A first current may be supplied to the magnetic substance to start moving the magnetic domain walls of the magnetic substance. After the magnetic domain walls begin moving, a second current lower than the first current may be supplied to the magnetic substance together with the high frequency magnetic field. The second current may be a high frequency current or a direct current. An additional high frequency magnetic field may be supplied when a current lower than the first current is supplied to the magnetic substance. The frequency of the additional high frequency magnetic field may be in the range of about 1 to about 10 GHz, inclusive. Another high frequency magnetic field may be supplied to the magnetic substance in a state where the magnetic domain walls are stationary. The frequency of the other high frequency magnetic field may be in the range of about 1 to about 10 GHz, inclusive. The information storage device may include a wire formed adjacent to the magnetic substance to generate the high frequency magnetic field.

At least one example embodiment provides an information storage device. The information storage device, according to at least this example embodiment, may include a magnetic substance and at least one wire. The magnetic substance may include magnetic domain walls, and the at least one wire may supply a first high frequency magnetic field to the magnetic substance.

At least one example embodiment provides an information storage device. According to at least this example embodiment, the information storage device may include a data recording medium and a record head. The record head may record data in the data recording medium. The record head may include a magnetic substance having magnetic domain walls and a wire for supplying a high frequency magnetic field to the magnetic substance.

According to at least this example embodiment, the magnetic substance may include a bent portion adjacent to the data recording medium. Data recorded in the data recording medium may be determined according to a magnetization direction of the magnetic domain wall disposed in the bent portion. The wire may be formed adjacent to the bent portion.

At least one other example embodiment provides an information storage device include a magnetic substance having magnetic domain walls for recording data, a writer and a reader. The writer may record data in the magnetic substance. The reader may read data from the magnetic substance. The wire may supply a high frequency magnetic field to the magnetic substance. A plurality of wires may be formed adjacent to the magnetic substance.

BRIEF DESCRIPTION OF THE DRAWINGS

Example embodiments will become more apparent by describing in detail example embodiments thereof with reference to the attached drawings in which:

FIGS. 4 and 5 are cross-sectional views illustrating methods of operating an information storage device using a magnetic domain wall movement according to another example embodiment.

DETAILED DESCRIPTION OF EXAMPLE EMBODIMENTS

Figure 1A:
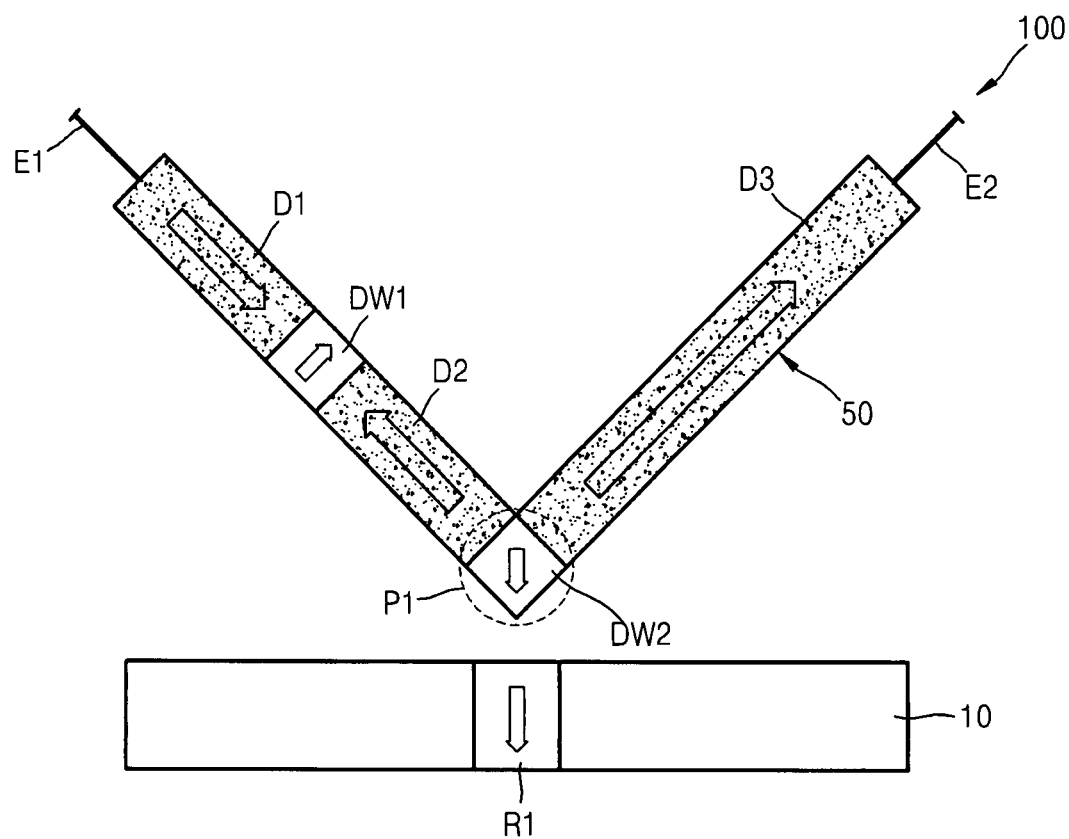
FIGS. 1A through 1D are views illustrating a method of operating an information storage device using a magnetic domain wall movement according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIGS. 1A through 1D illustrate a method of operating an information storage device using magnetic domain wall movement (hereinafter, referred to as "first operating method") according to an example embodiment.

Referring to FIG. 1A, the information storage device may include a data recording medium 10 and a record head 100 for recording data in the data recording medium 10. The data recording medium 10 and the record head 100 may be spaced apart from one another by a given gap. The record head 100 may include a magnetic substance 50 having a plurality of magnetic domains and employing a property enabling magnetic domain wall movement. The magnetic substance 50 may include a bent portion P1 adjacent to the data recording medium 10 and first and second magnetic domain walls DW1 and DW2. The first and second magnetic domain walls DW1 and DW2 may have different polarities. Reference numerals D1, D2 and D3 denote first, second and third magnetic domains, respectively. The first, second and third magnetic domains D1, D2 and D3 may be separated by the first and second magnetic domain walls DW1 and DW2. The magnetic substance 50 may have at least two magnetic domain walls and at least three magnetic domains.

First and second wires E1 and E2 may be formed on either end of the magnetic substance 50. A current for a magnetic domain wall movement may be supplied to the magnetic substance 50 through the first and second wires E1 and E2.

The bent portion P1 may be a pinning region of a moving magnetic domain wall. For example, the first and second magnetic domain walls DW1 and DW2, which start moving in response to a supplied current (e.g., having a critical value or more), may stop in the bent portion P1. The first and second magnetic domain walls DW1 and DW2 may have opposite polarities. Accordingly, data recorded in the data recording medium 10 may be determined according to a magnetization direction of the magnetic domain wall positioned in the bent portion P1.

For example, as illustrated in FIG. 1A, when the second magnetic domain wall DW2 is disposed in the bent portion P1, a first region R1 of the data recording medium 10 may be magnetized in the same direction as that of the second magnetic domain wall DW2. As a result, first data may be recorded in the first region R1. The first data may be "0" or "1".

Figure 1B:
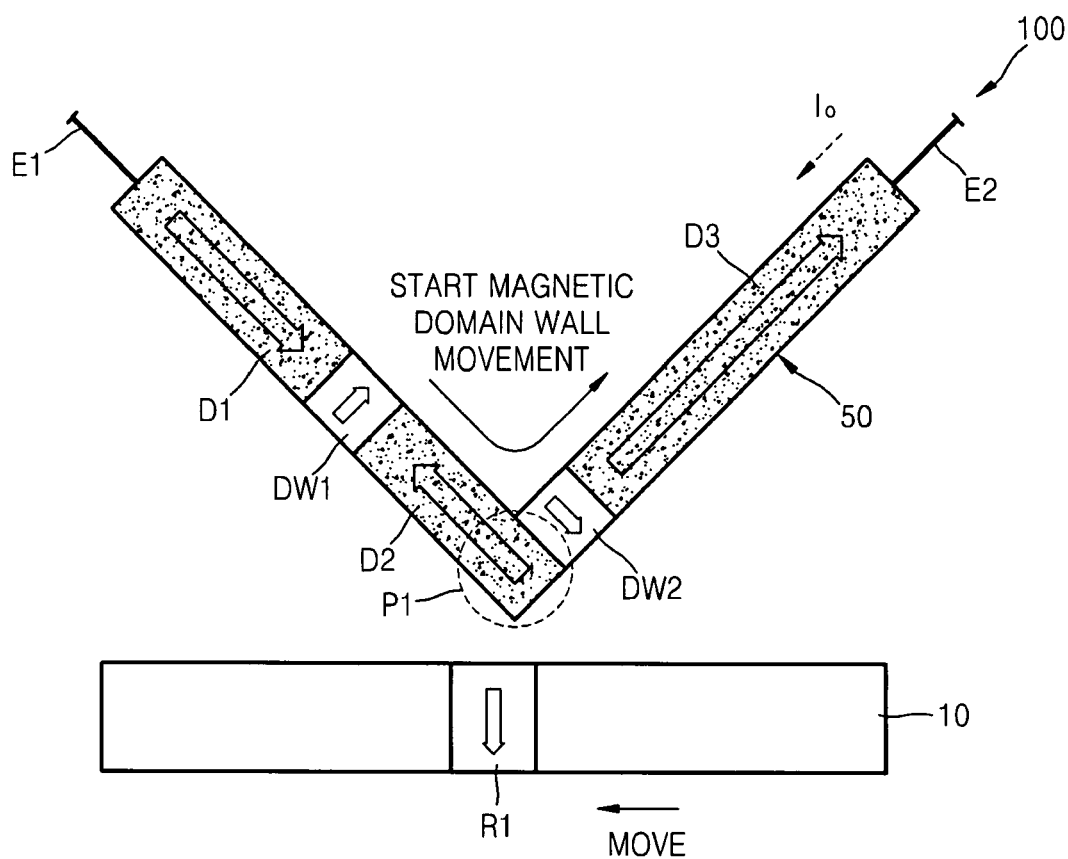

Referring to FIG. 1B, when the data recording medium 10 is moved, a first current $I_o$ for starting magnetic domain wall movement may be supplied to the magnetic substance 50. The first current $I_o$ may flow from the second wire E2 to the first wire E1. The first current $I_o$ may have a magnitude and may be supplied for a time period sufficient to free the second magnetic domain wall DW2 from the bent portion P1 (e.g., the pinning region). Because the moving direction of a magnetic domain wall in a magnetic substance is the same as the electron flow, the first magnetic domain wall DW1 moves in an opposite direction to that of the current.

Figure 1C:
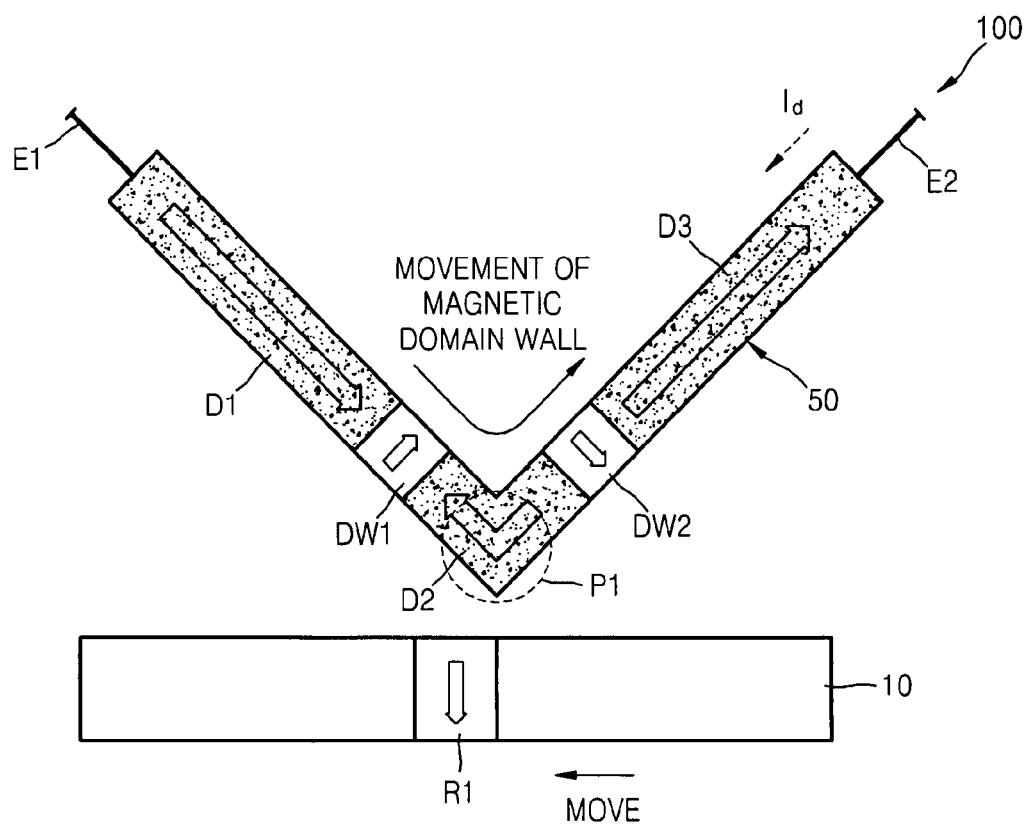

Referring to FIG. 1C, after the second magnetic domain wall DW2 is freed from the bent portion P1 the data recording medium 10 may continue to move and a first high frequency current $I_d$ may be supplied to the magnetic substance 50. The first high frequency current $I_d$ may have a magnitude lower than the first current $I_o$. The direction of the first high frequency current $I_d$ may be the same or substantially the same as that of the first current $I_o$. The first high frequency current $I_d$ may be a current for maintaining the mobility of the first and second magnetic domain walls DW1 and DW2, which may begin in response to the first current $I_o$. The first high frequency current $I_d$ may be supplied until the first magnetic domain wall DW1 reaches the bent portion P1. As a result, the second magnetic domain wall DW2 may move toward the second wire E2.

Fine pinning regions, which may form unintentionally, may exist in other areas of the magnetic substance 50 except for the bent portion P1. The fine pining regions may be defects, which exist on a surface of the magnetic substance 50. A current lower than the first current $I_o$ may be needed to overcome a resistance due to the fine pinning regions. In at least this example embodiment, the first high frequency current $I_d$ may be used as a current for overcoming the resistance due to the fine pinning regions. In the conventional art, a direct current may be used as the current for overcoming a resistance due to the fine pinning regions. When direct current is used, however, the first and second magnetic domain walls DW1 and DW2 may not be rapidly freed from the fine pinning regions. According to example embodiments, when the first high frequency current $I_d$ is used, the first and second magnetic domain walls DW1 and DW2 may be freed from the fine pinning regions more rapidly because the position of the first and second magnetic domain walls DW1 and DW2 oscillate and move more rapidly and finely. Because resonance effect occurs due to the first high frequency current $I_d$, the movement velocity of the magnetic domain wall may also increase. According to at least this example embodiment, the movement velocity of the magnetic domain wall may be increased to about 1000 m/s or greater.

An interval between the first and second magnetic domain walls DW1 and DW2 may be about 300 nm. According to the conventional art, a time in the range of about 30 to about 300 ns may be needed to move a magnetic domain wall about 300 nm, which corresponds to a data transfer rate of 30 megabits per sec (Mbps). According to at least some example embodiments, an information storage device may have a data transfer rate of several gigabits per sec (Gbps) because only 0.3 ns may be needed for moving a magnetic domain wall about 300 nm.

When the first magnetic domain wall DW1 reaches the bent portion P1, the first and second magnetic domain walls DW1 and DW2 may no longer move because the first high frequency current $I_d$ has a magnitude lower than the first current $I_o$. The magnitudes of the current $I_o$ and/or the first high frequency current $I_d$ may be altered according to the structure of the record head 100 and/or the type of magnetic substance 50 used.

Figure 1D:
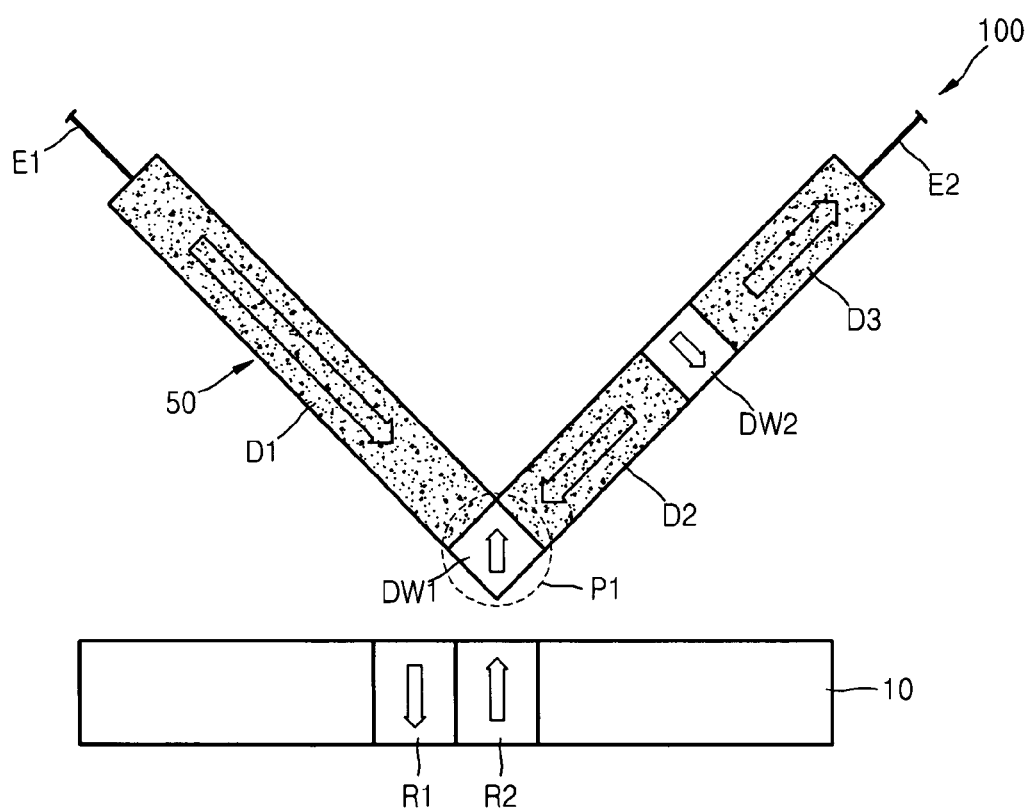

FIG. 1D illustrates a case in which the first magnetic domain wall DW1 reaches the bent portion P1. Referring to FIG. 1D, when the first magnetic domain wall DW1 is positioned in the bent portion P1, and the bent portion P1 is positioned above a second region R2 of the data recording medium 10, the second region R2 may be magnetized in the same direction as that of the first magnetic domain wall DW1. As a result, a second data may be recorded in the second region R2. The second data may be "0" or "1", and may be different from the first data. When the first and second magnetic domain walls DW1 and DW2 stop, a second high frequency current may be supplied to the magnetic substance 50. The second high frequency current and the first high frequency current $I_d$ may be the same or different. The magnitude of a current required to begin moving the first and second magnetic domain walls DW1 and DW2 may be reduced by supplying the second high frequency current to the magnetic substance 50. The frequencies of the first high frequency current $I_d$ and/or the second high frequency current may be in the range of about 1 to about 10 GHz, inclusive.

Artificial pinning regions such as a notch may be formed in portions of the record head 100. For example, Artificial pinning regions may be formed in a portion in which the first magnetic domain wall DW1 is positioned in FIG. 1A, and a portion in which the second magnetic domain wall DW2 is positioned in FIG. 1D.

Figure 2:
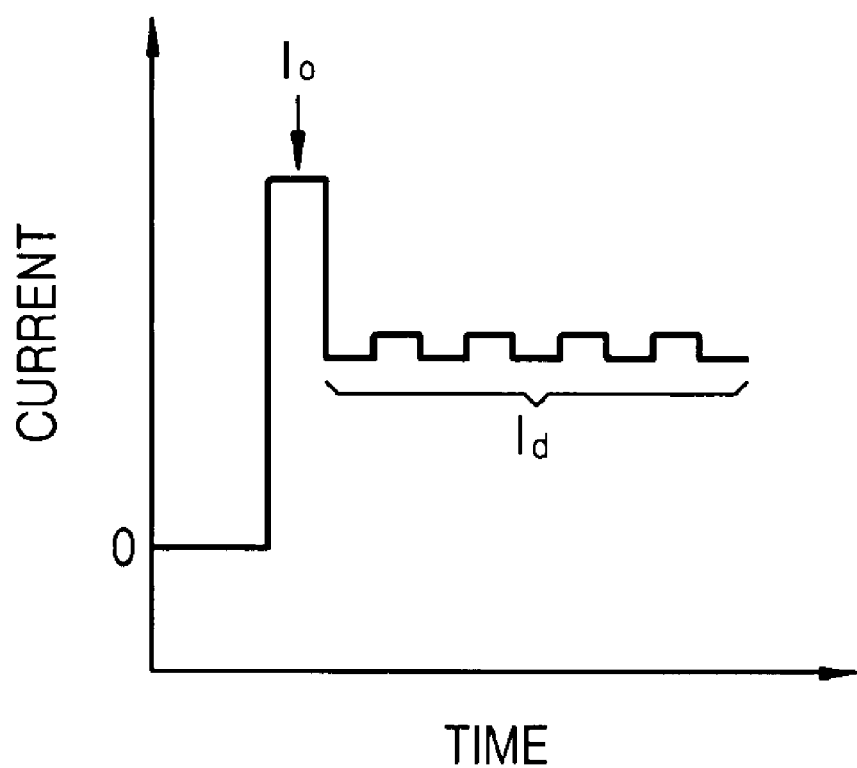
FIG. 2 is a graph illustrating a high frequency current which is supplied to a magnetic substance in the operating method of FIGS. 1A through 1D.

FIG. 2 is a graph illustrating a first current $I_o$ and a first high frequency current $I_d$ supplied to the magnetic substance 50 in the example embodiment illustrated in FIGS. 1A through 1D. The magnitudes of the first current $I_o$ and/or the first high frequency current $I_d$ may be altered according to the structure of the record head 100 and/or the type of magnetic substance 50 used.

FIGS. 3A through 3D illustrate a method of operating an information storage device using magnetic domain wall movement (hereinafter, referred to as "second operating method") according to another example embodiment.

The record head 200 used in the second operating method may include the record head 100 of the information storage device of FIG. 1A and a wire C.

Figure 3A:
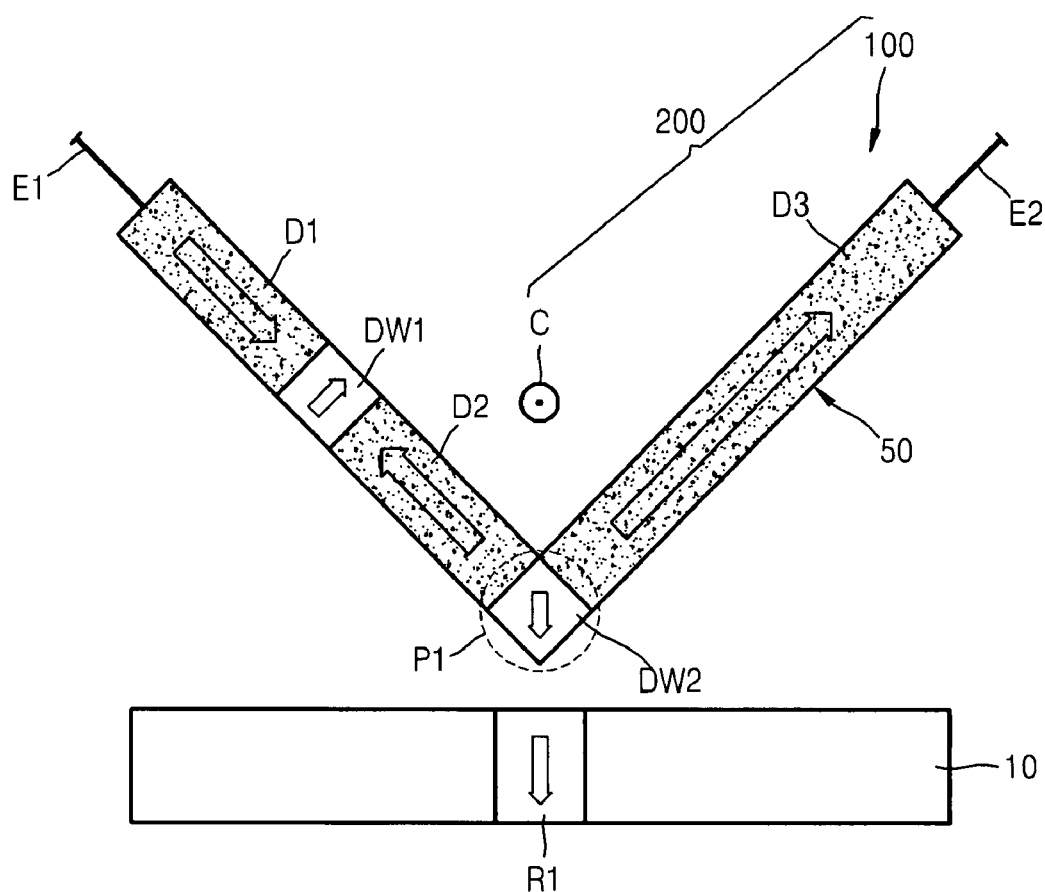
FIGS. 3A through 3D are views illustrating a method of operating an information storage device using a magnetic domain wall movement according to another example embodiment.

Referring to FIG. 3A, the wire C may be adjacent to the magnetic substance 50, for example, to the bent portion P1 of the magnetic substance 50. When the second magnetic domain wall DW2 is positioned in the bent portion P1, the first and second operating methods may be the same or substantially the same in that first data may be recorded in a first region R1 of the data recording medium 10.

Figure 3B:
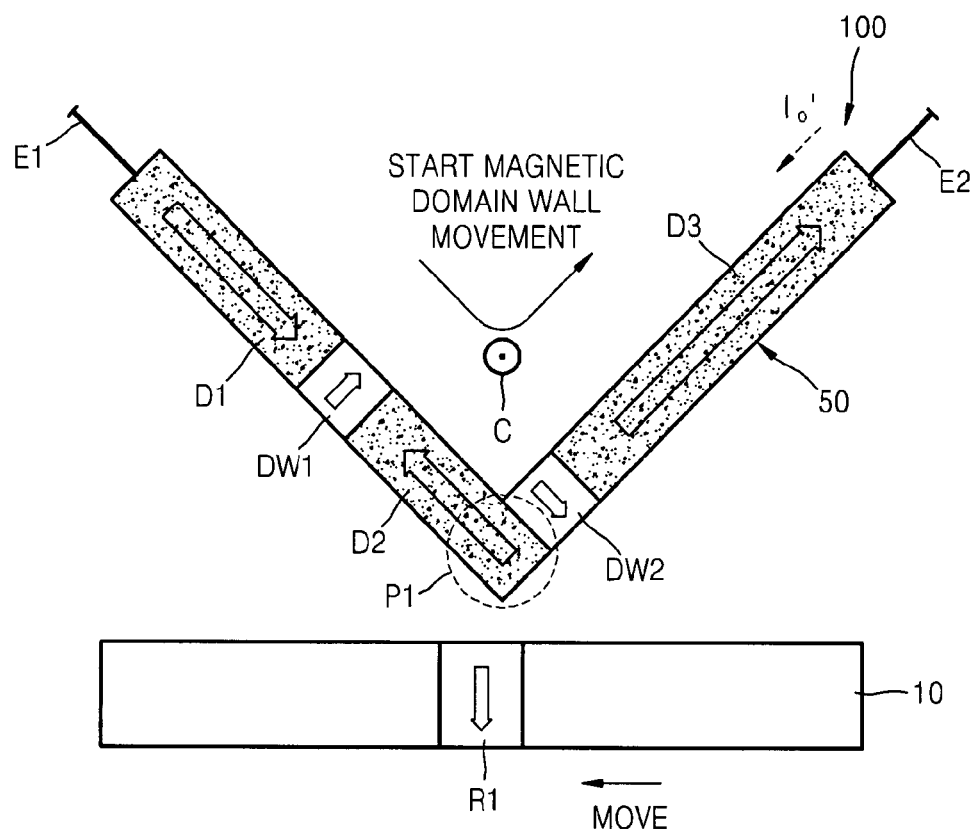

Referring to FIG. 3B, when the data recording medium 10 is moved, a first current $I_o'$ for starting magnetic domain wall movement may be supplied to the magnetic substance 50. The first current $I_o'$ may flow from a second wire E2 through the bent portion P1 to a first wire E1. The first current $I_o'$ may have a magnitude and duration sufficient to free the second magnetic domain wall DW2 from the bent portion P1, for example, the pinning region.

Figure 3C:
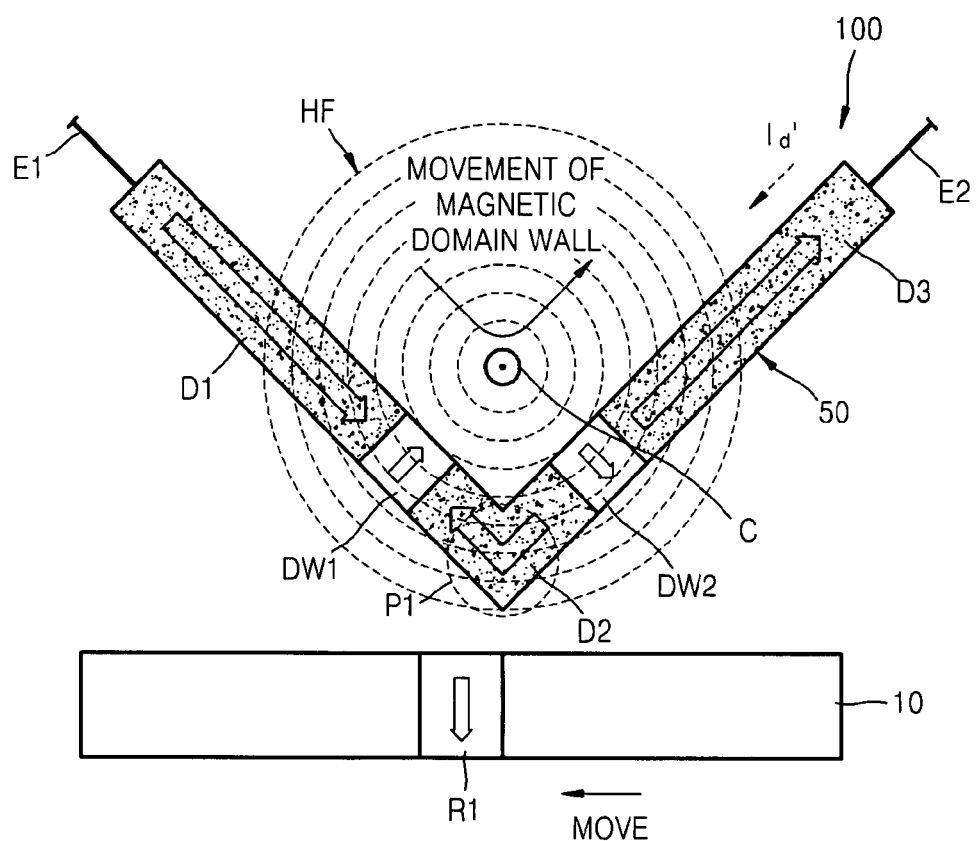

Referring to FIG. 3C, when the data recording medium 10 is moved (e.g., continuously), a second current $I_d'$ lower than the first current $I_o'$ and a high frequency magnetic field HF may be supplied to the magnetic substance 50. The high frequency magnetic field HF may be generated by an alternating current flowing in the wire C. The frequency of the high frequency magnetic field HF may be in the range of about 1 to about 10 GHz, inclusive. The second current $I_d'$ may be a current for maintaining the mobility of the first and second magnetic domain walls DW1 and DW2, which may begin moving as a result of the first current $I_o'$. The second current $I_d'$ may be a direct current or an alternating current.

When the first and second magnetic domain walls DW1 and DW2 are moved and the high frequency magnetic field HF is supplied to the magnetic substance 50, the first and second magnetic domain walls DW1 and DW2 may move more rapidly from fine pinning regions existing on a surface of the magnetic substance 50 because the first and second magnetic domain walls DW1 and DW2 oscillate and move more rapidly and/or finely.

Figure 3D:
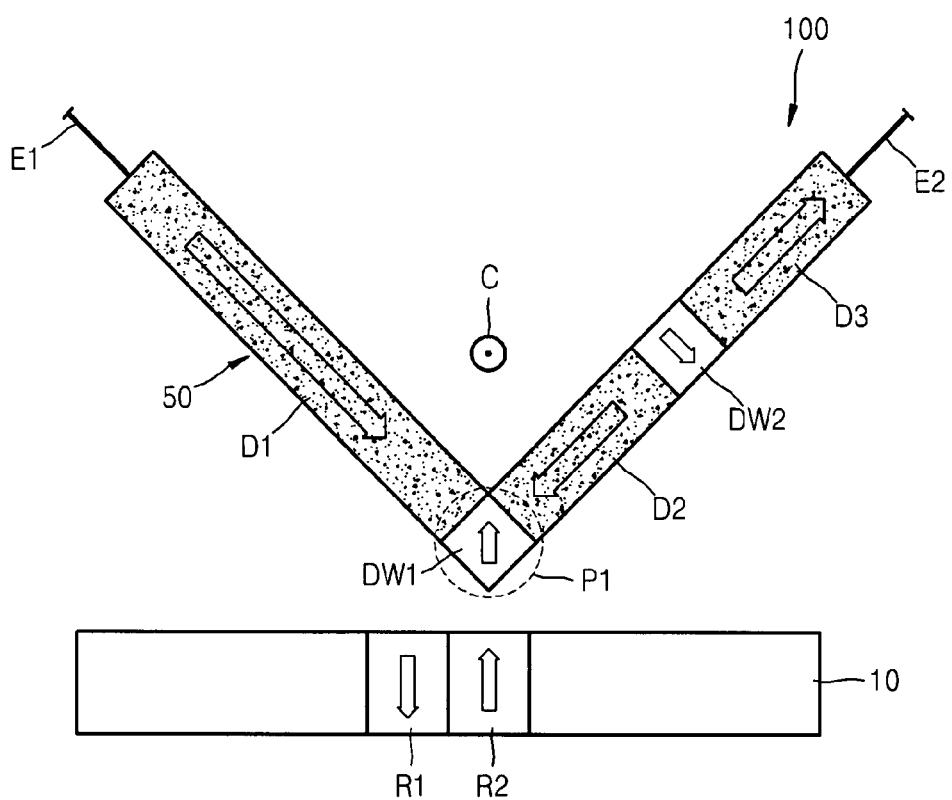

Referring to FIG. 3D, when the first magnetic domain wall DW1 reaches the bent portion P1, the first and second magnetic domain walls DW1 and DW2 may stop.

When the first magnetic domain wall DW1 is disposed in the bent portion P1, and the bent portion P1 is disposed above a second region R2 of the data recording medium 10, the second region R2 may be magnetized in the same direction as that of the first magnetic domain wall DW1. As a result, second data may be recorded in the second region R2. Although not shown, when the first and second magnetic domain walls DW1 and DW2 stop moving, a high frequency magnetic field may be supplied to the magnetic substance 50. The applied high frequency magnetic field may be the same or substantially the same as the high frequency magnetic field HF. In addition, referring back to FIG. 3B, although not shown for the sake of clarity, when the first current $I_o'$ is supplied to the magnetic substance 50, a high frequency magnetic field which may also be applied. The high frequency magnetic field may be the same or substantially the same as the high frequency magnetic field HF. Accordingly, the magnitude of a current for starting moving of the first and second magnetic domain walls DW1 and DW2 may be reduced.

In methods according to example embodiments, magnetic domain walls may move more rapidly in the record heads 100 and 200. For example, methods according to example embodiments may be used to rapidly move magnetic domain walls in a magnetic recording layer in which data may be recorded.

FIG. 4 is a cross-sectional view illustrating a method of operating an information storage device using magnetic domain wall movement (hereinafter, referred to as "third operating method") according to another example embodiment.

Referring to FIG. 4, the information storage device used in the third operating method may include a magnetic recording layer 400 having a plurality of magnetic domains. A plurality of notches (not shown) dividing the magnetic recording layer 400 into magnetic domain units may be formed in the surface of magnetic recording layer 400. The magnetic domain walls DW may be moved by a single magnetic domain unit using the notches. Third and fourth wires E3 and E4 for supplying a current may be formed on either end of the magnetic recording layer 400. A writer 500 for recording data in the magnetic recording layer 400 and a reader 500 for reading data from the magnetic recording layer 400 may be formed on the magnetic recording layer 400. The writer 500 and the reader 600 may be spaced apart from one another. Each of the writer 500 and the reader 600 may be a tunnel magneto resistance (TMR) head, a giant magneto resistance (GMR) head or the like. In the information storage device of FIG. 4, when the magnetic recording layer 400, the writer 500 and the reader 600 are fixed, the magnetic domain walls DW in the magnetic recording layer 400 may be moved to perform a reading/writing operation.

The first operating method illustrated in FIGS. 1A through 1D may be used for starting movement of, maintaining movement of and/or stopping of the magnetic domain walls DW of the magnetic recording layer 400.

For example, a current supplied to the magnetic recording layer 400 to start, maintain and/or stop movement of the magnetic domain walls DW of the magnetic recording layer 400 may be the same or substantially the same as the magnitude of a current supplied to the magnetic layer 50 to begin, maintain and/or stop movement of the first and second magnetic domain walls DW1 and DW2 of the magnetic layer 50. However, the current supplied to the magnetic layer 50 and the current supplied to the magnetic recording layer 400 may be different according to the shapes and/or materials of the record head 100 and the magnetic recording layer 400.

Referring to FIG. 4, a high frequency current $I_d''$ may be supplied to the magnetic recording layer 400 to maintain movement of the magnetic domain walls DW of the magnetic recording layer 400, and thus, the movement velocity of the magnetic domain walls DW may increase. In one example, the high frequency current $I_d''$ may be the same or substantially the same as the high frequency current $I_d$ of the first operating method.

FIG. 5 is a cross-sectional view illustrating a method of operating an information storage device using magnetic domain wall movement (hereinafter, referred to as "fourth operating method") according to another example embodiment. The information storage device shown in FIG. 5 may be similar to the information storage device used in the third operating method, but may further include a plurality of wires C.

Referring to FIG. 5, the plurality of wires C may be disposed adjacent to a magnetic recording layer 400 of the information storage device of FIG. 4. The wires C may be spaced apart from each other, and each of the wires C may be disposed between notches (not shown) formed in the surface of the magnetic recording layer 400. The fourth operating method may be similar or substantially similar to the second operating method shown in FIGS. 3A through 3D. In this example embodiment, a current and/or magnetic field supplied to the magnetic recording layer 400 to start, maintain and/or stop movement of the of the magnetic domain walls DW of the magnetic recording layer 400 may be the same or substantially the same as that of the second operating method shown in FIGS. 3A-3D.

For example, a high frequency magnetic field HF' and a current $I_d'''$ may be supplied to the magnetic recording layer 400 to move the magnetic domain walls DW. As a result, the movement velocity of the magnetic domain walls DW may increase. The high frequency magnetic field HF' and a current $I_d'''$ may be the same or substantially the same as the high frequency magnetic field HF and the current $I_d'$ of the second operating method.

According to at least some example embodiments, the movement velocity of magnetic domain walls may be increased using a high frequency current and/or a high frequency magnetic field, and thus, the velocity of data reading/writing of an information storage device using magnetic domain wall movement may increase.

While example embodiments have been particularly shown and described, it will be understood by those of ordinary skill in the art that the above descriptions are only examples. For example, it will be understood by those of ordinary skill in the art that various changes in the structures of the record heads 100 and 200 and the magnetic recording layer 400 may be made. In addition, in at least some example embodiments, a magnetic domain wall may be moved after the movement of the record heads 100 and 200 is completed.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A method of operating an information storage device including a magnetic substance having magnetic domain walls, the method comprising:

supplying at least one of a first high frequency current and a first high frequency magnetic field to the magnetic substance while magnetic domain walls of the magnetic substance are moved.

2. The method of claim 1, wherein the first high frequency current is supplied to the magnetic substance while magnetic domain walls of the magnetic substance are moved.

3. The method of claim 2, further including, supplying a second high frequency current to the magnetic substance to start moving the magnetic domain walls, the second current being greater than the first high frequency current.

4. The method of claim 3, wherein the second high frequency current is supplied to the magnetic substance in a state in which the magnetic domain walls are stationary.

5. The method of claim 3, wherein the frequency of the second high frequency current is in the range of 1 to 10 GHz.

6. The method of claim 3, wherein the first and second high frequency currents are same.

7. The method of claim 3, wherein the first and second high frequency currents are different.

8. The method of claim 2, wherein the frequency of the first high frequency current is in the range of about 1 to about 10 GHz, inclusive.

9. The method of claim 2, wherein the data information storage device further includes a data recording medium, and the magnetic substance includes a bent portion adjacent to a data recording medium, the method further including, recording data in the data recording medium based on a magnetization direction of the magnetic domain wall positioned in the bent portion.

10. The method of claim 1, wherein the first high frequency magnetic field is supplied to the magnetic substance while magnetic domain walls of the magnetic substance are moved.

11. The method of claim 10, the frequency of the first high frequency magnetic field is in the range of about 1 to about 10 GHz, inclusive.

12. The method of claim 10, further including, supplying a first current to the magnetic substance to start moving the magnetic domain walls.

13. The method of claim 12, further including, supplying a second current to the magnetic substance after starting movement of the magnetic domain walls, the second current being applied concurrently with the high frequency magnetic field, and the second current being smaller than the first current.

14. The method of claim 13, wherein the second current is a high frequency current or a direct current.

15. The method of claim 13, further including, supplying a second high frequency magnetic field when the second current is supplied to the magnetic substance.

16. The method of claim 15, wherein the frequency of the second high frequency magnetic field is in the range of about 1 to about 10 GHz, inclusive.

17. The method of claim 10, further including, supplying a second high frequency magnetic field to the magnetic substance to begin movement of the magnetic domain walls when the magnetic domain walls are stationary.

18. The method of claim 17, wherein the frequency of the second high frequency magnetic field is in the range of about 1 to about 10 GHz, inclusive.

19. The method of claim 10, wherein first high frequency magnetic field is supplied by a wire included in the record head.

20. The method of claim 10, wherein the magnetic substance includes a bent portion adjacent to the data recording medium, and the method further includes,
 recording data in the data recording medium based on a magnetization direction of the magnetic domain wall positioned in the bent portion.

21. The method of claim 1, wherein the information storage device further includes a writer for recording data in the magnetic substance and a reader for reading data from the magnetic substance, and the first high frequency current is supplied to the magnetic substance while magnetic domain walls of the magnetic substance are moved.

22. The method of claim 21, further including,
 supplying a second high frequency current to the magnetic substance to start moving the magnetic domain walls, the second high frequency current being greater than the first high frequency current.

23. The method of claim 22, wherein a second high frequency current is supplied to the magnetic substance when the magnetic domain walls are stationary.

24. The method of claim 22, wherein the frequency of the second high frequency current is in the range of about 1 to about 10 GHz, inclusive.

25. The method of claim 22, wherein the first and second high frequency currents are the same.

26. The method of claim 22, wherein the first and second high frequency current are different.

27. The method of claim 21, wherein the frequency of the first high frequency current is in the range of about 1 to about 10 GHz, inclusive.

28. The method of claim 1, wherein the information storage device further includes a writer for recording data in the magnetic substance and a reader for reading data from the magnetic substance, and the first high frequency magnetic field is supplied to the magnetic substance while magnetic domain walls of the magnetic substance are moved.

29. The method of claim 28, wherein the frequency of the high frequency magnetic field is in the range of about 1 to about 10 GHz, inclusive.

30. The method of claim 28, further including,
 supplying a first current to the magnetic substance to begin moving the magnetic domain walls.

31. The method of claim 30, further including,
 supplying a second current to the magnetic substance concurrently with the first high frequency magnetic field, the second current being supplied after starting movement of the magnetic domain walls, and the second current being lower than the first current.

32. The method of clam 31, wherein the second current is a high frequency current or a direct current.

33. The method of claim 31, further including,
 supplying a second high frequency magnetic field concurrently with the second current.

34. The method of claim 33, wherein the frequency of the second high frequency magnetic field is in the range of about 1 to about 10 GHz, inclusive.

35. The method of claim 28, further including,
 supplying a second high frequency magnetic field when the magnetic domain walls are stationary.

36. The method of claim 35, wherein the frequency of the second high frequency magnetic field is in the range of about 1 to about 10 GHz, inclusive.

37. The method of claim 28, wherein the first high frequency magnetic field is generated by a wire formed adjacent to the magnetic substance.

* * * * *